(12) United States Patent
Su et al.

(10) Patent No.: US 11,600,719 B2
(45) Date of Patent: Mar. 7, 2023

(54) BIPOLAR JUNCTION DEVICE

(71) Applicant: Taiwan Semiconductor Manufacturing Company, Ltd., Hsin-Chu (TW)

(72) Inventors: Zi-Ang Su, Taoyuan County (TW); Ming-Shuan Li, Hsinchu County (TW); Chih Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/706,346

(22) Filed: Mar. 28, 2022

(65) Prior Publication Data

US 2022/0216330 A1    Jul. 7, 2022

Related U.S. Application Data

(62) Division of application No. 17/038,286, filed on Sep. 30, 2020, now Pat. No. 11,289,591.

(51) Int. Cl.
| | |
|---|---|
| *H01L 29/737* | (2006.01) |
| *H01L 29/73* | (2006.01) |
| *H01L 29/06* | (2006.01) |
| *H01L 29/167* | (2006.01) |
| *H01L 29/10* | (2006.01) |
| *H01L 29/165* | (2006.01) |

(52) U.S. Cl.
CPC ...... *H01L 29/7371* (2013.01); *H01L 29/0649* (2013.01); *H01L 29/7308* (2013.01); *H01L 29/1004* (2013.01); *H01L 29/165* (2013.01); *H01L 29/167* (2013.01)

(58) Field of Classification Search
CPC ............ H01L 29/7371; H01L 21/8249; H01L 27/0623
See application file for complete search history.

(56) References Cited

U.S. PATENT DOCUMENTS

| | | |
|---|---|---|
| 8,373,229 B2 | 2/2013 | Chen et al. |
| 9,368,594 B2 | 6/2016 | Chang et al. |
| 9,991,254 B1 | 6/2018 | Cheng |
| 2018/0342596 A1* | 11/2018 | Lee ..................... H01L 27/0924 |
| 2019/0267376 A1 | 8/2019 | Chiang et al. |
| 2020/0075743 A1 | 3/2020 | Lee |

* cited by examiner

*Primary Examiner* — Syed I Gheyas
(74) *Attorney, Agent, or Firm* — Haynes and Boone, LLP

(57) ABSTRACT

The present disclosure provides embodiments of bipolar junction transistor (BJT) structures. A BJT according to the present disclosure includes a first epitaxial feature disposed over a well region, a second epitaxial feature disposed over the well region, a vertical stack of channel members each extending lengthwise between the first epitaxial feature and the second epitaxial feature, a gate structure wrapping around each of the vertical stack of channel members, a first electrode coupled to the well region, an emitter electrode disposed over and coupled to the first epitaxial feature, and a second electrode disposed over and coupled to the second epitaxial feature.

20 Claims, 15 Drawing Sheets

BIPOLAR JUNCTION DEVICE

PRIORITY DATA

This application is a divisional application of U.S. patent application Ser. No. 17/038,286, filed Sep. 30, 2020, the entirety of which is incorporated by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices, such as fin field-effect transistors (FinFETs) and multi-bridge-channel (MBC) transistors (also known as gate-all-around (GAA) transistors, surrounding gate transistors (SGTs), nanowire transistors, or nanosheet transistors), have been introduced in an effort to improve gate control by increasing gate-channel coupling, reduce OFF-state current, and reduce short-channel effects (SCEs). The three-dimensional structure of the multi-gate devices allows them to be aggressively scaled while maintaining gate control and mitigating SCEs.

Current-controlled active devices, such as bipolar junction transistors (BJTs), may be integrated with voltage-controlled multi-gate devices to meet various design needs. Although conventional BJTs are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
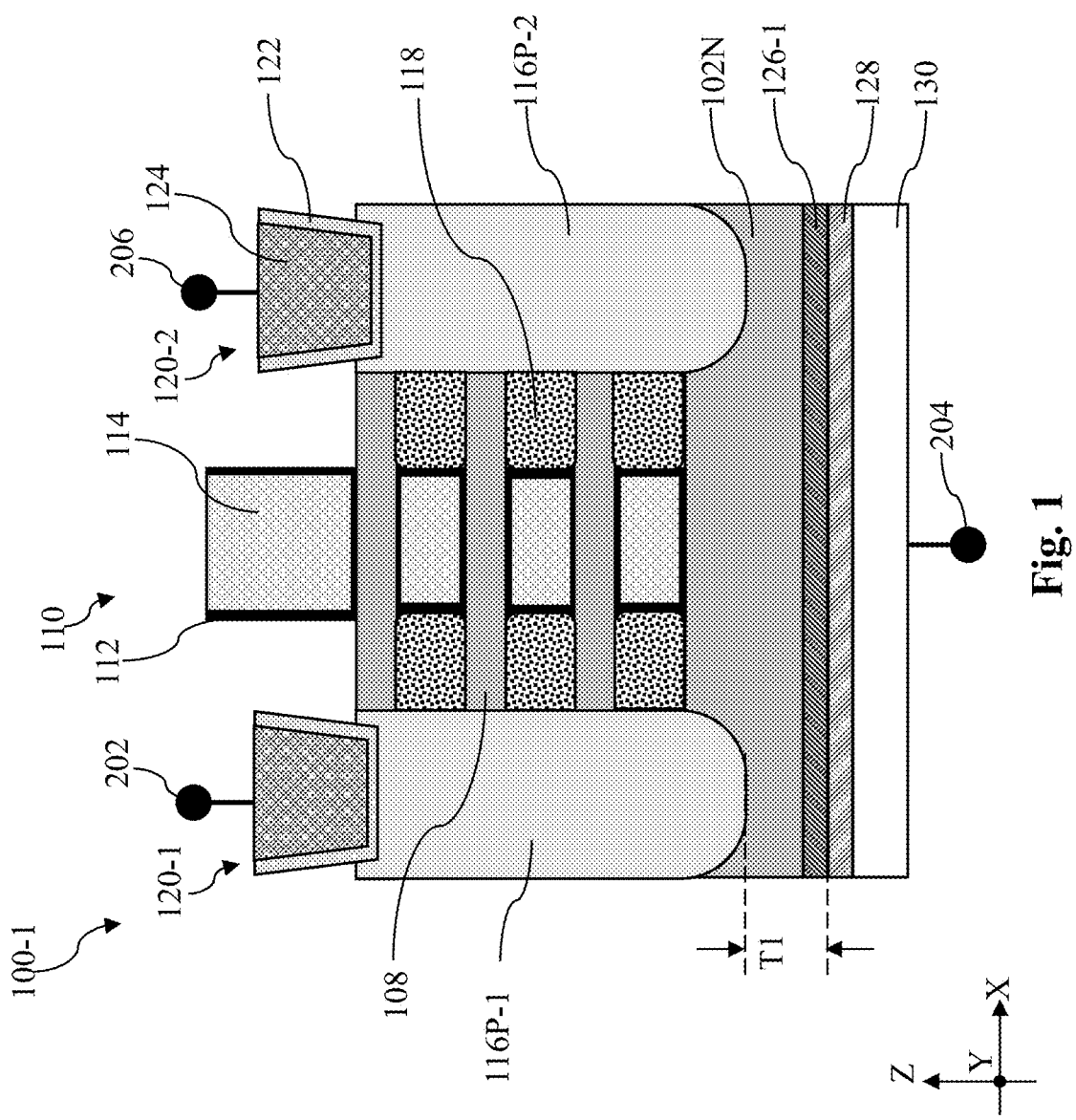
FIG. 1 is a fragmentary cross-section view a first device structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure generally relates to semiconductor devices. Particularly, the present disclosure relates to bipolar junction transistors fabricated along with multi-gate transistors.

Some example BJTs include three source/drain features formed over an active region and respectively coupled to an emitter electrode, a collector electrode, and a base electrode. The emitter electrode, collector electrode, and base electrode in these example BJTs are routed through front-side source/drain contacts. The present disclosure provides BJT structures that may be fabricated along with MBC transistors and include two source/drain features disposed over a doped well region. In various embodiments, the two source/drain features are coupled to front-side source/drain features and the doped well region is coupled to a backside power rail. The two front-side source/drain features and the backside power rail may serve as the emitter electrode, the collector electrode, and the base electrode of a BJT. As compared to BJTs that span across three source/drain features and have electrical routing on the front side, the BJTs spanning across two source/drain features and electrically routed on both sides have a smaller footprint and improved routing.

Figure 2:
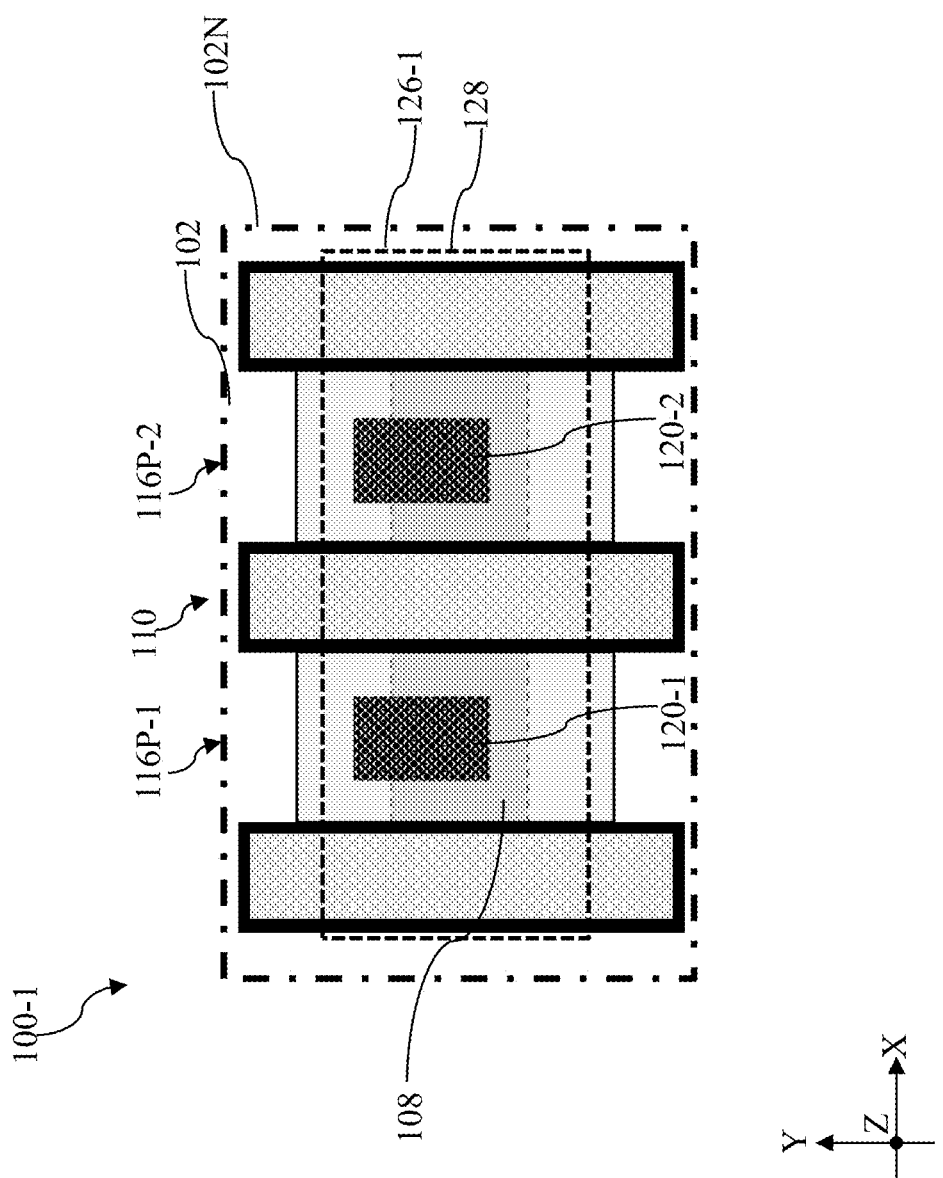
FIG. 2 is a fragmentary top view of the first device structure in FIG. 1, according to various aspects of the present disclosure.
Figure 3:
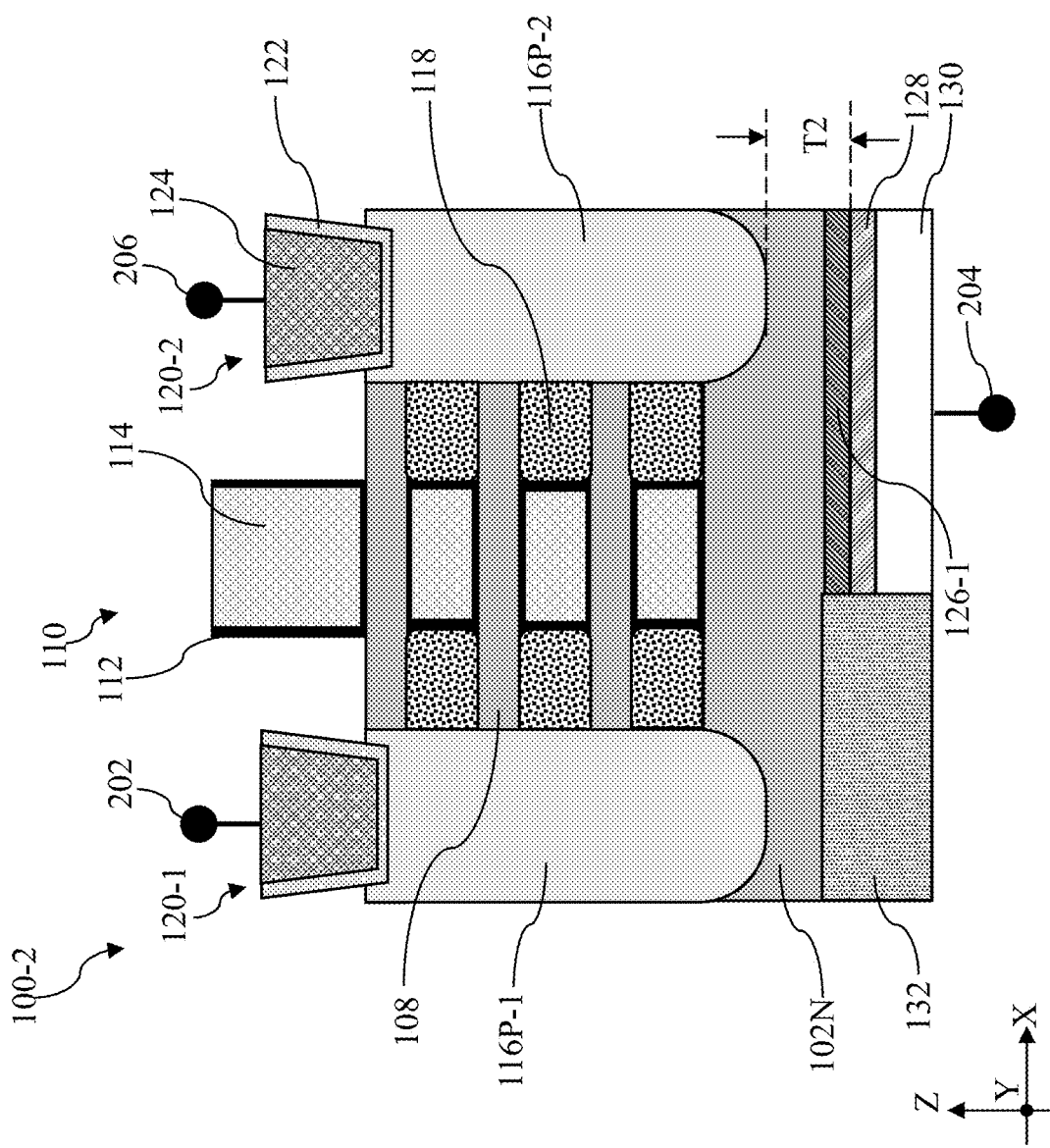
FIG. 3 is a fragmentary cross-section view a second device structure, according to various aspects of the present disclosure.
Figure 4:
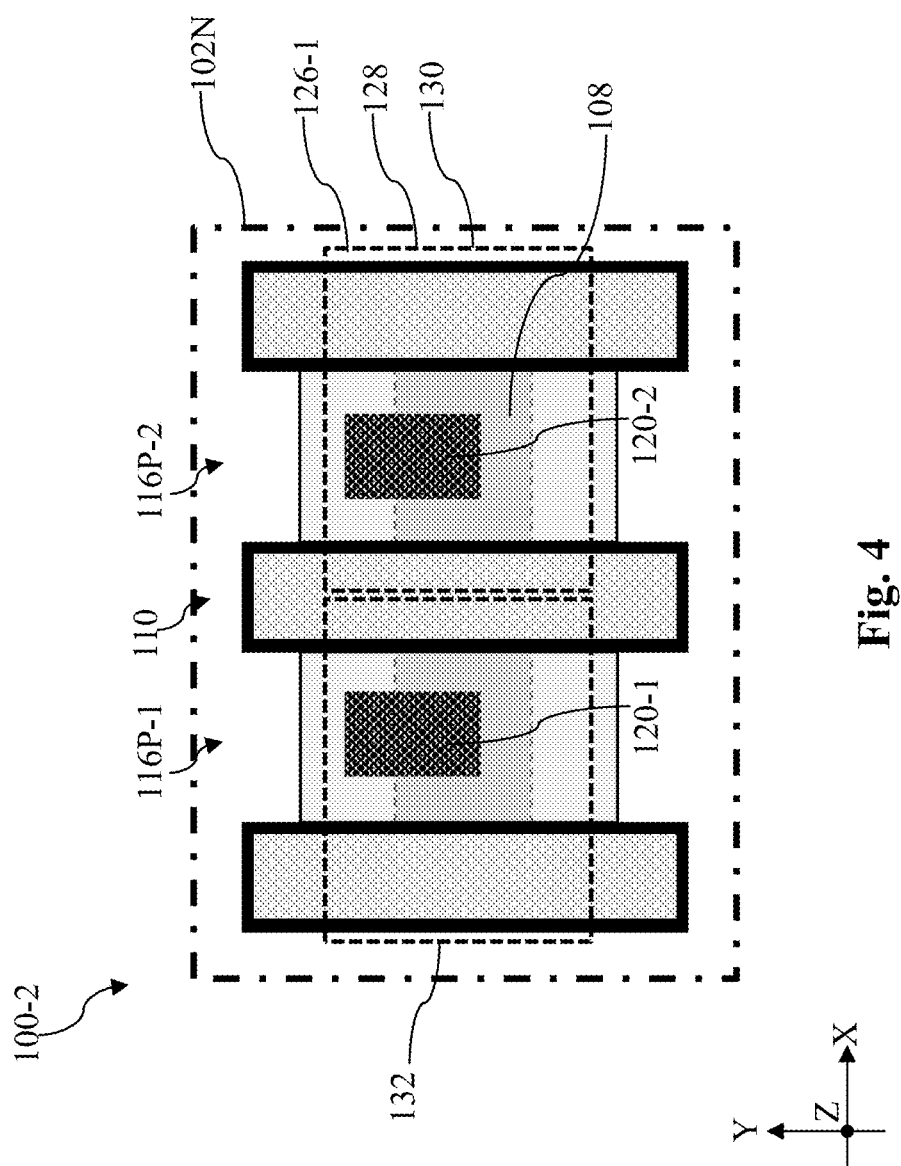
FIG. 4 is a fragmentary top view of the second device structure in FIG. 3, according to various aspects of the present disclosure.
Figure 5:
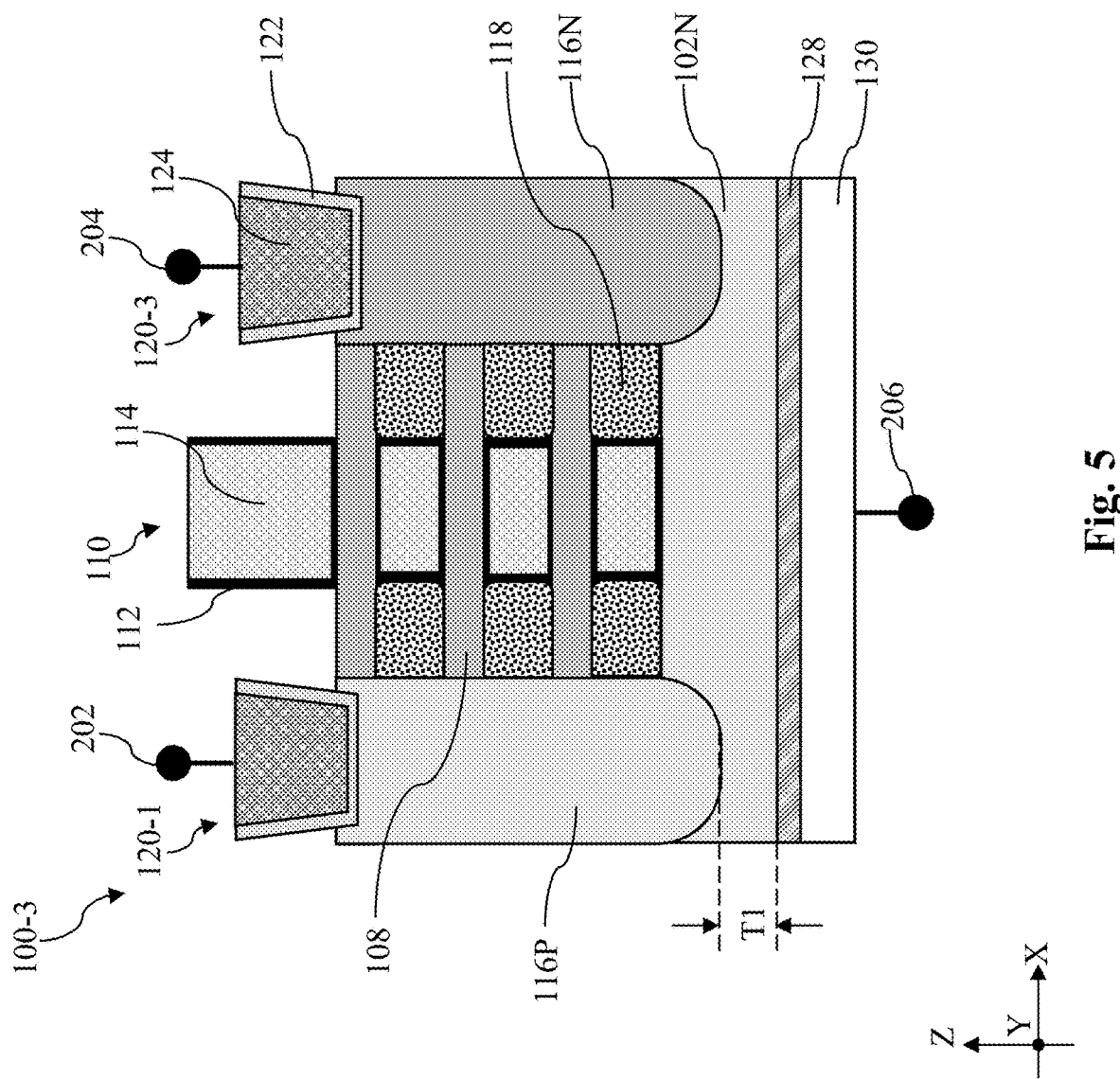
FIG. 5 is a fragmentary cross-section view a third device structure, according to various aspects of the present disclosure.
Figure 6:
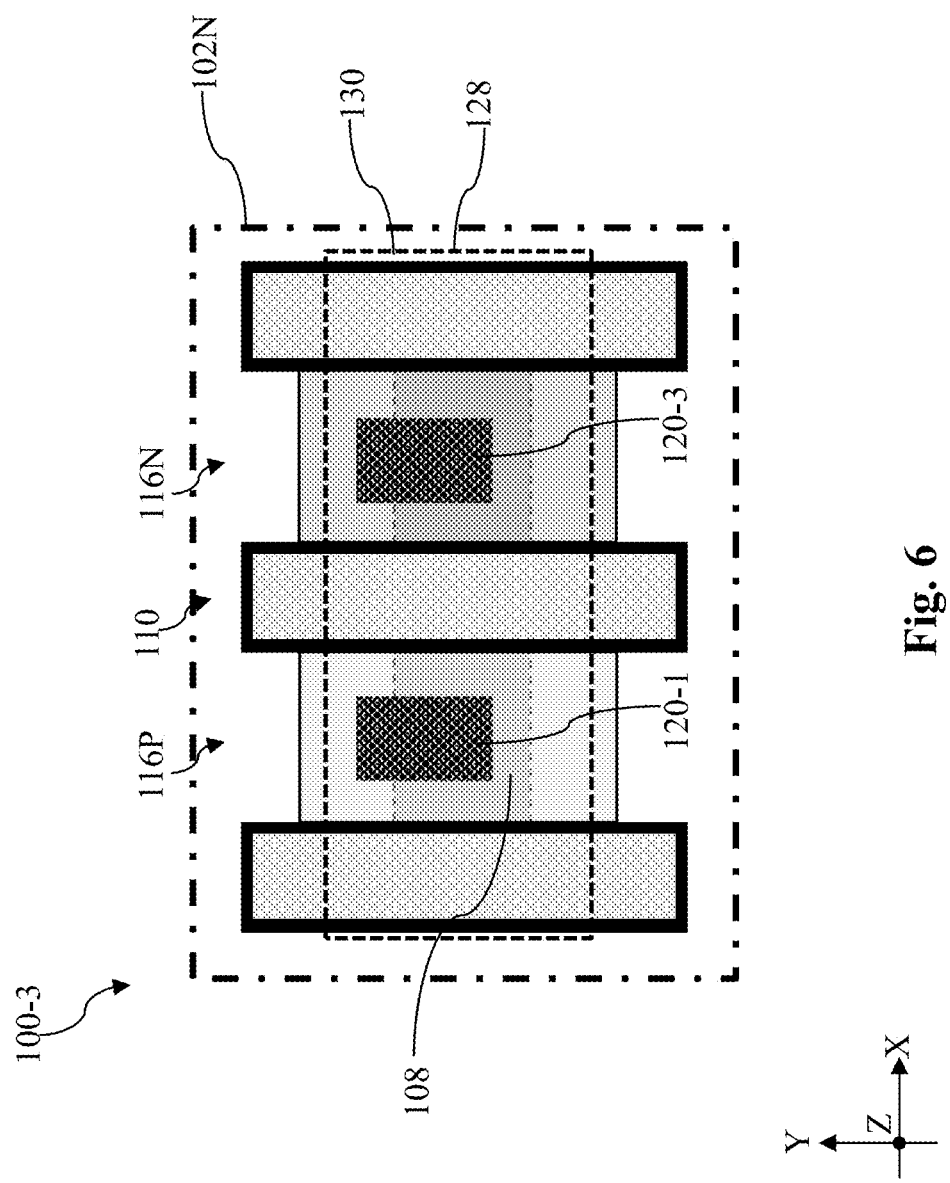
FIG. 6 is a fragmentary top view of the third device structure in FIG. 5, according to various aspects of the present disclosure.
Figure 7:
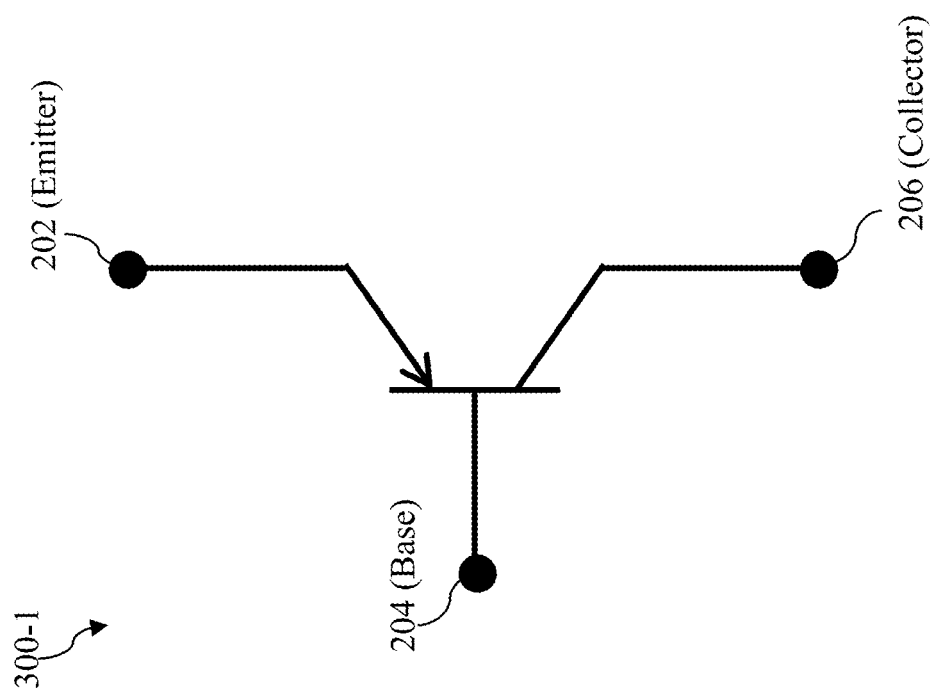
FIG. 7 illustrates an equivalent circuit diagram of the first device structure in FIG. 1, the second device structure in FIG. 3, or the third device structure in FIG. 5, according to various aspects of the present disclosure.
Figure 8:
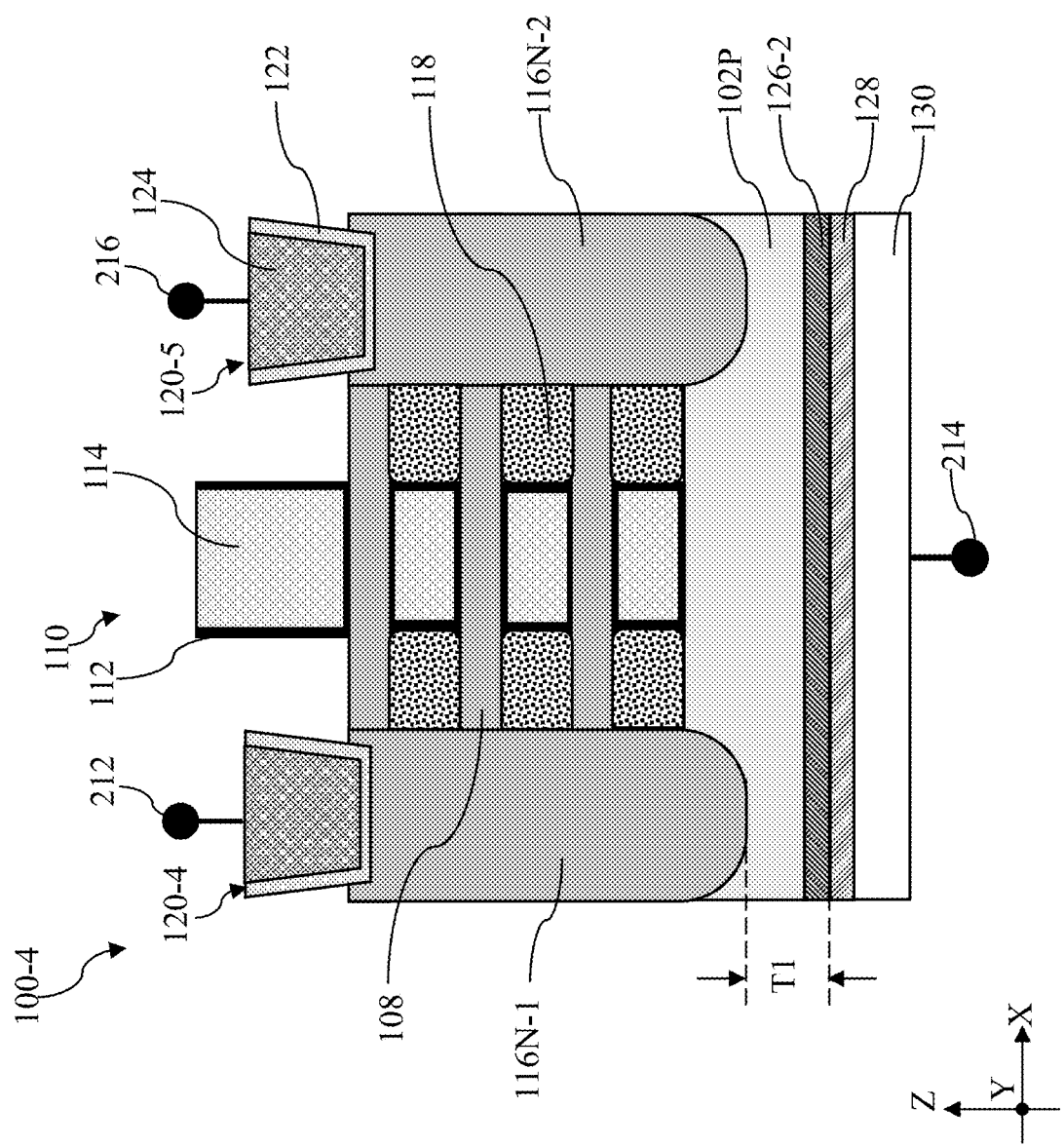
FIG. 8 is a fragmentary cross-section view a fourth device structure, according to various aspects of the present disclosure.
Figure 9:
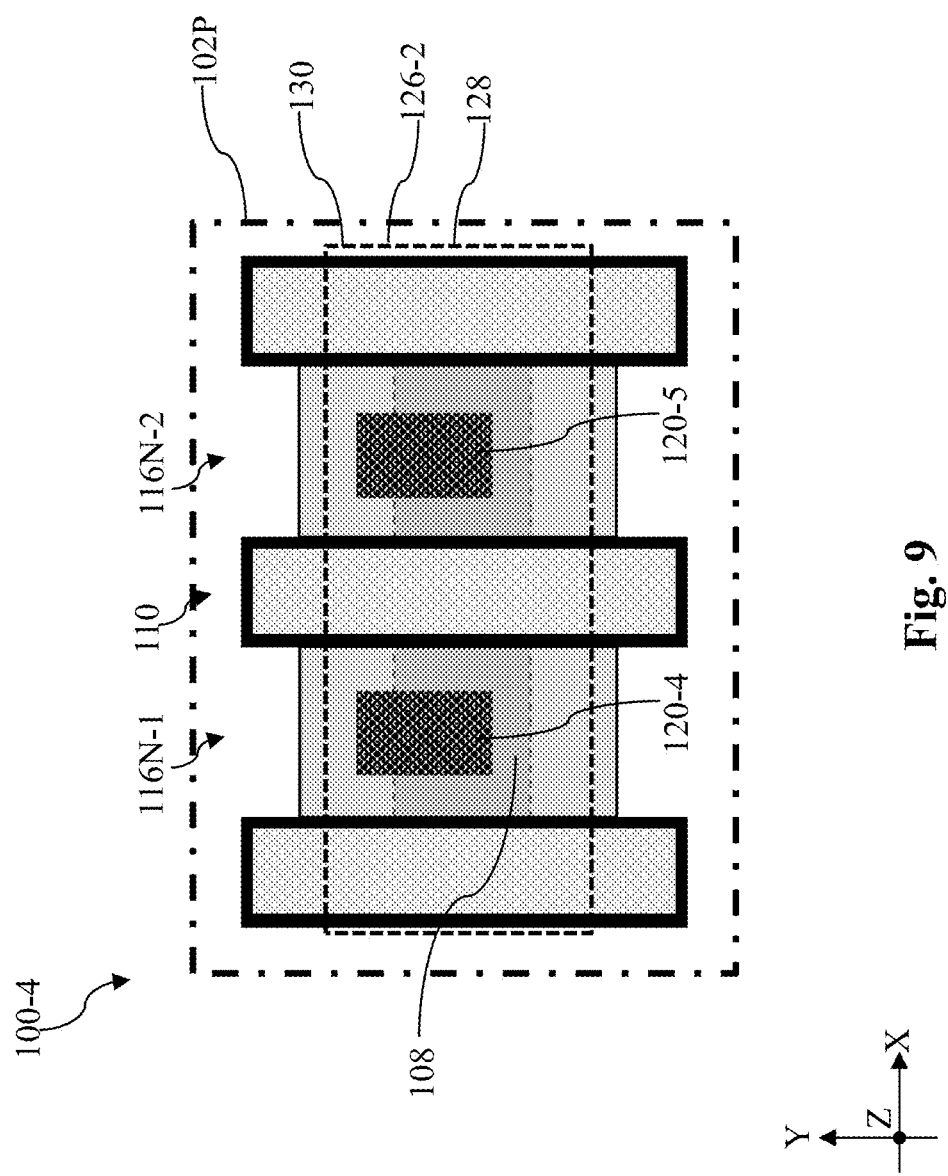
FIG. 9 is a fragmentary top view of the fourth device structure in FIG. 8, according to various aspects of the present disclosure.
Figure 10:
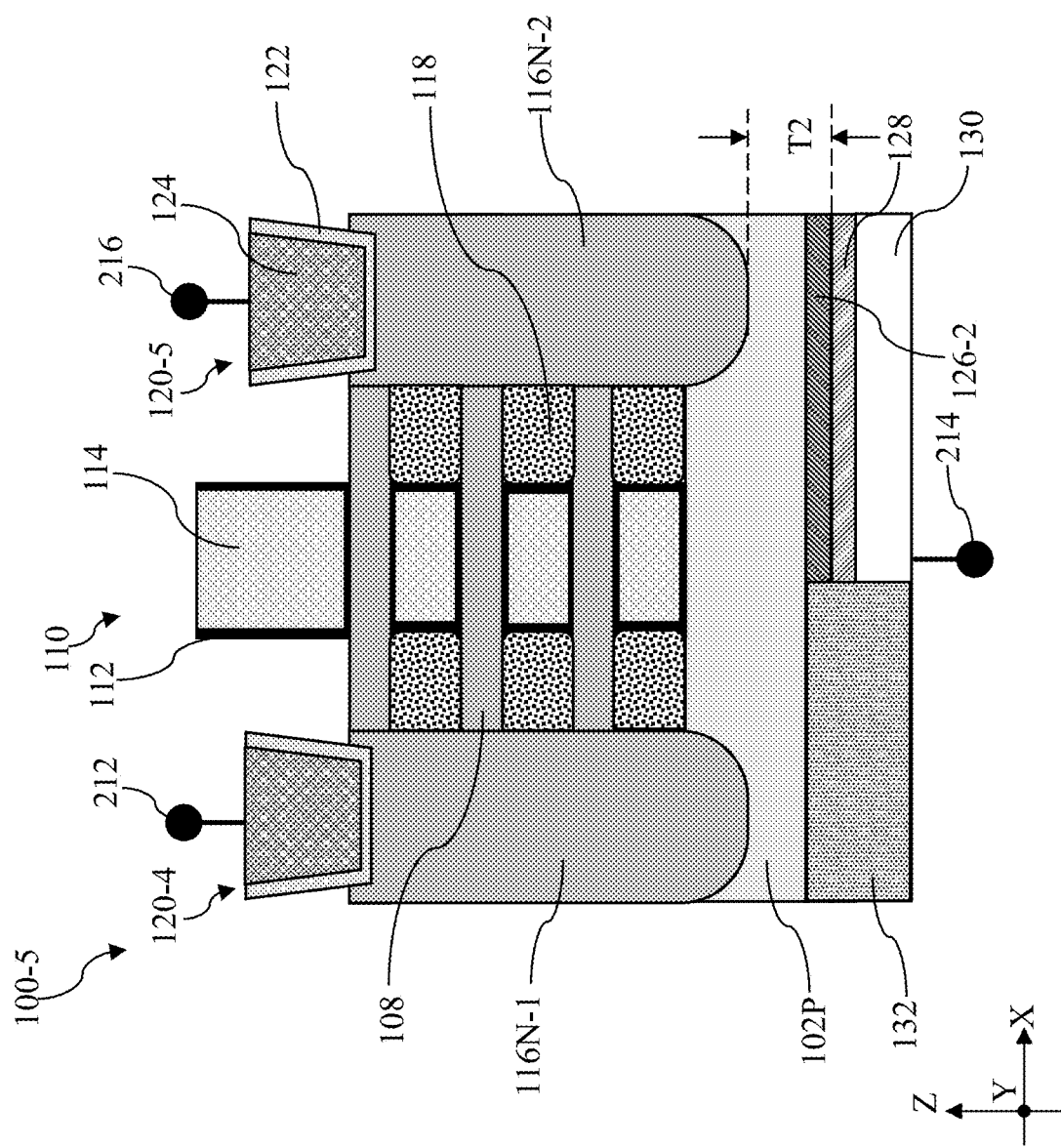
FIG. 10 is a fragmentary cross-section view a fifth device structure, according to various aspects of the present disclosure.
Figure 11:
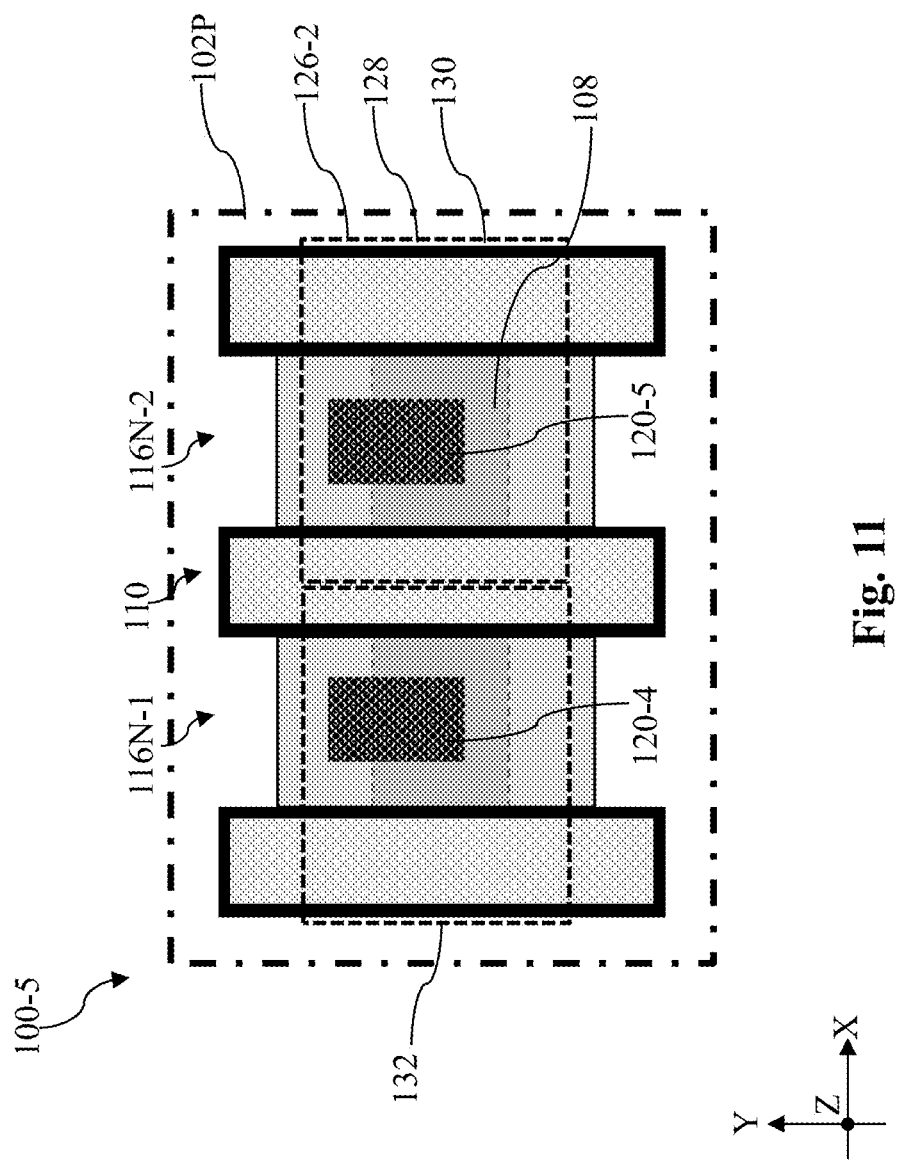
FIG. 11 is a fragmentary top view of the fifth device structure in FIG. 10, according to various aspects of the present disclosure.
Figure 12:
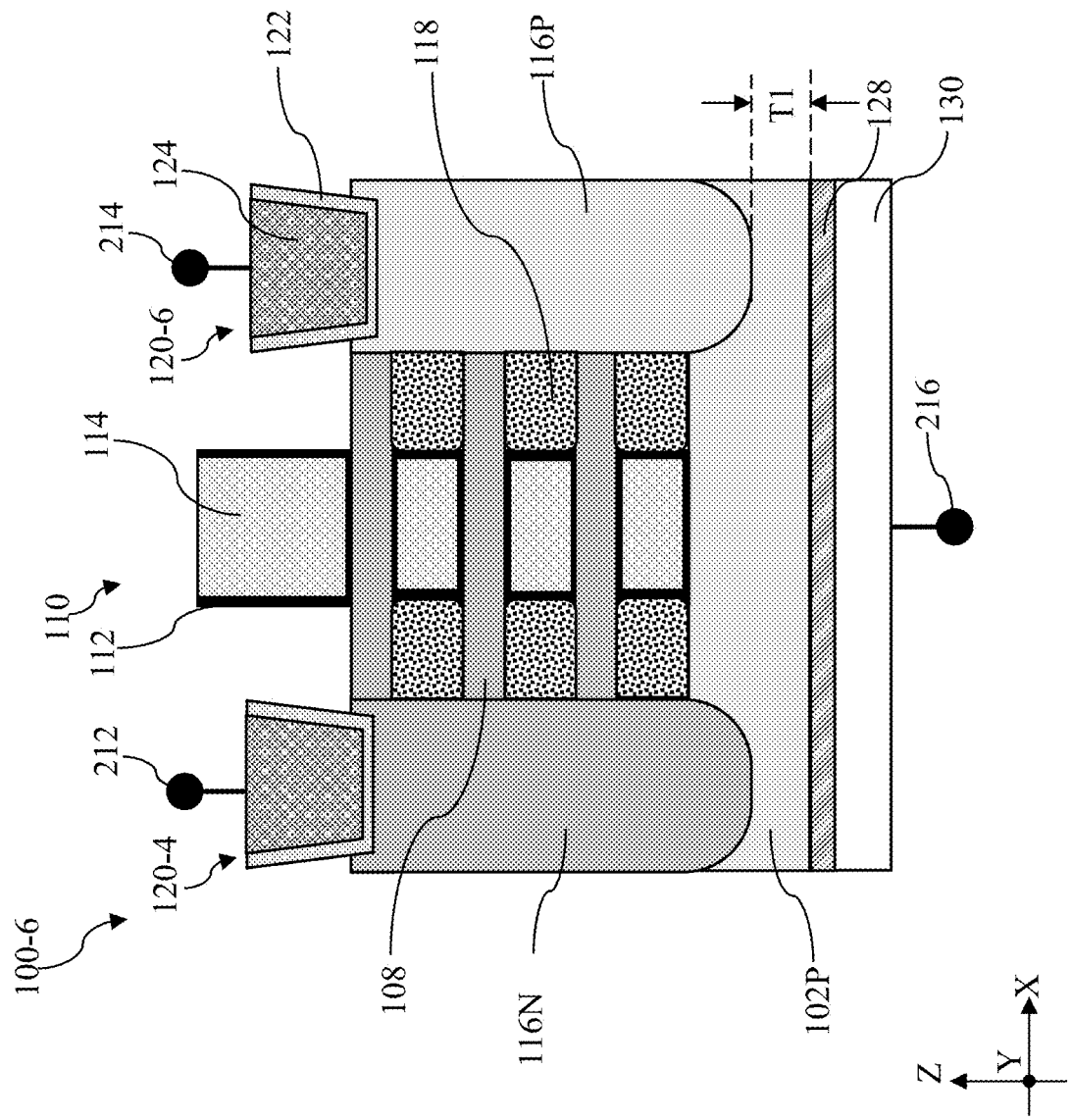
FIG. 12 is a fragmentary cross-section view a sixth device structure, according to various aspects of the present disclosure.
Figure 13:
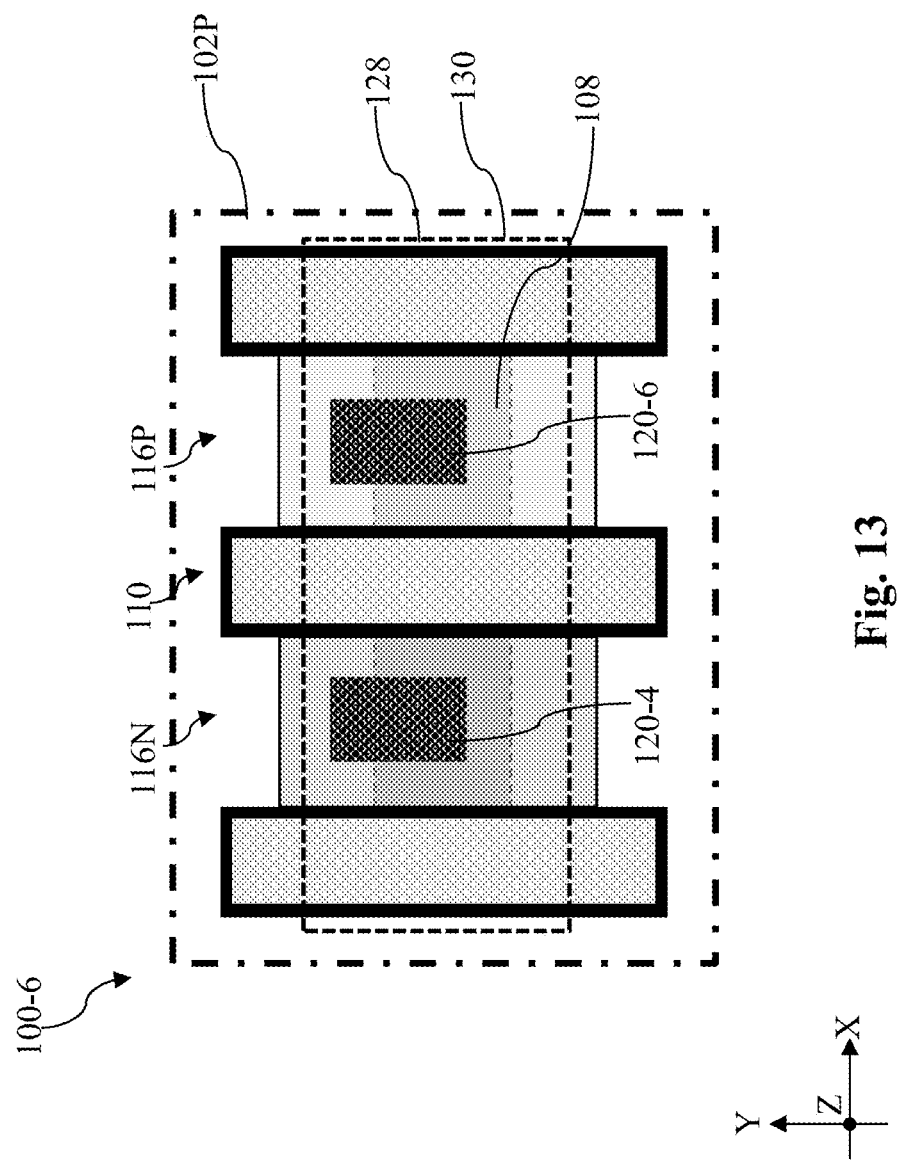
FIG. 13 is a fragmentary top view of the sixth device structure in FIG. 12, according to various aspects of the present disclosure.
Figure 14:
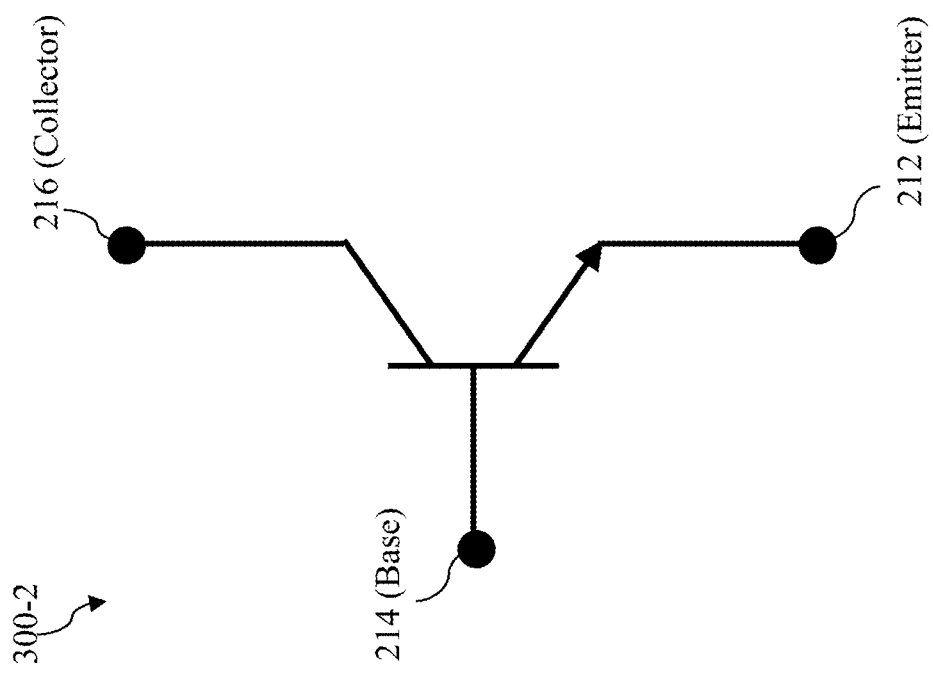
FIG. 14 illustrates an equivalent circuit diagram of the fourth device structure in FIG. 8, the fifth device structure in FIG. 10, or the sixth device structure in FIG. 12, according to various aspects of the present disclosure.
Figure 15:
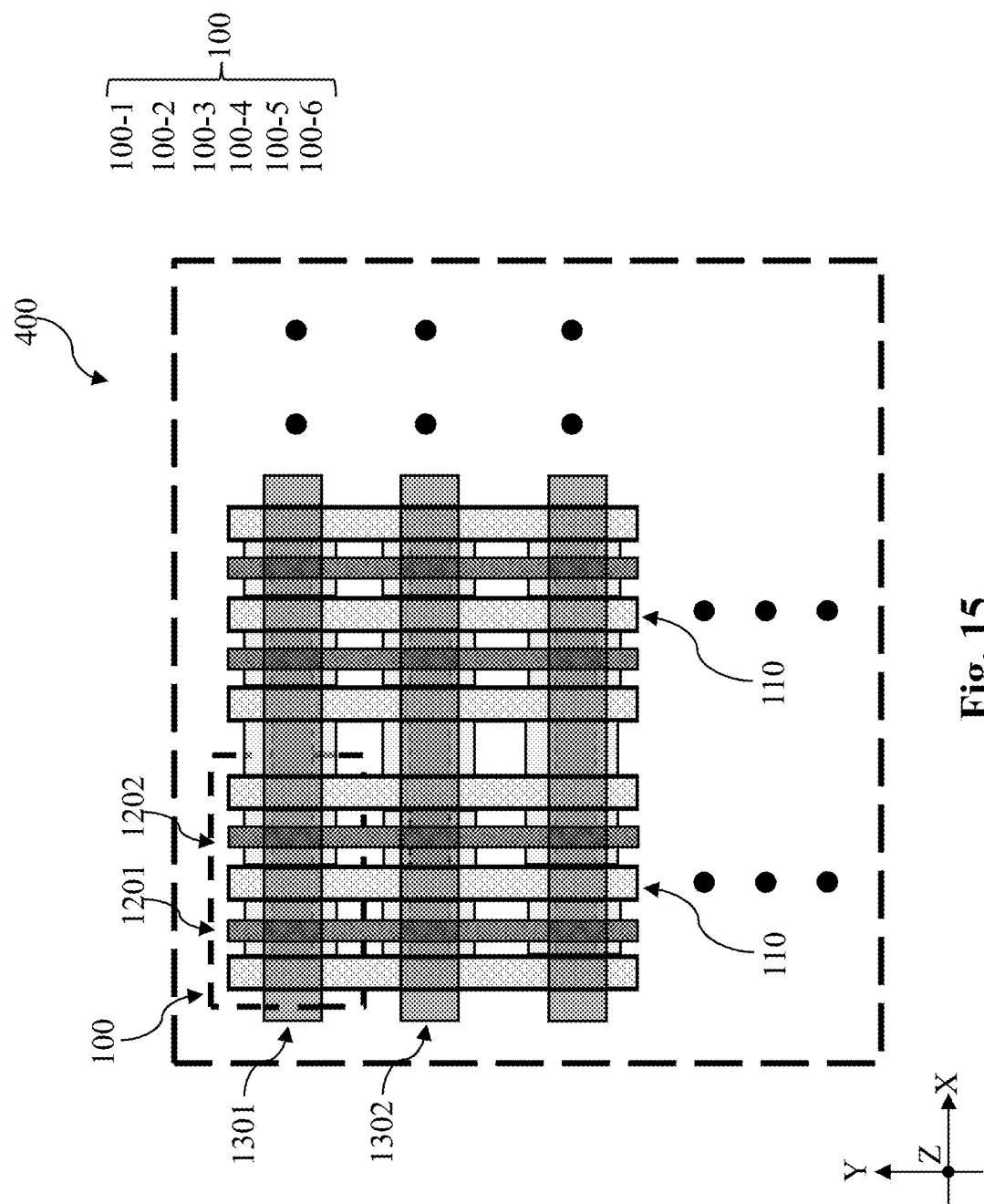
FIG. 15 illustrates a fragmentary top view of a semiconductor device that includes multiple semiconductor devices connected in parallel, according to various aspects of the present disclosure.

The various aspects of the present disclosure will now be described in more detail with reference to the figures. Among the figures, FIGS. 1 and 2 illustrate a first device structure 100-1; FIGS. 3 and 4 illustrate a second device structure 100-2; FIGS. 5 and 6 illustrate a third device structure 100-3; FIGS. 8 and 9 illustrate a fourth device structure 100-4; FIGS. 10 and 11 illustrate a fifth device structure 100-5; and FIGS. 12 and 13 illustrate a sixth device structure 100-6. FIG. 7 illustrates an equivalent circuit diagram of the first device structure 100-1, the second device structure 100-2, and the third device structure 100-3. FIG. 14 illustrates an equivalent circuit diagram of the fourth device structure 100-4, the fifth device structure 100-5, and the sixth device structure 100-6. FIG. 15 illustrates a fragmentary top view of a semiconductor device 400 that includes a plurality of device structures connected in parallel. Throughout the present disclosure, like reference numerals denote like features. The X, Y, Z directions in the figures are perpendicular to one another and are used consistently.

FIG. 1 illustrates a fragmentary cross-sectional view of a first device structure 100-1 viewed along the Y direction. In some embodiments represented in FIG. 1, the first device structure 100-1 has a structure similar to but not identical to a multi-bridge-channel (MBC) transistor that includes a plurality of bridge-like channel members (or channel structures). In FIG. 1, the first device structure 100-1 includes a plurality of channel members 108 extending along the X direction between a first p-type epitaxial feature 116P-1 and a second p-type epitaxial feature 116P-2. Because the first p-type epitaxial feature 116P-1 and the second p-type epitaxial feature 116P-2 are fabricated along with MBC transistors, they may also be referred to as first and second p-type source/drain features 116P-1 and 116P-2, respectively. The first device structure 100-1 includes a gate structure 110 that extends lengthwise along the Y direction. The gate structure 110 wraps around each of the plurality of channel members 108. As shown in FIG. 1, the gate structure 110 includes a gate dielectric layer 112 and a gate electrode 114. The gate structure 110 is isolated from the first and second p-type source/drain features 116P-1 and 116P-2 by a plurality of inner spacer features 118. The plurality of inner spacer features 118 interleave the plurality of channel members 108. A first source/drain contact 120-1 is disposed over and electrically coupled to the first p-type source/drain feature 116P-1 and a second source/drain contact 120-2 is disposed over and electrically coupled to the second p-type source/drain feature 116P-2. In some implementations represented in FIG. 1, each of the first source/drain contact 120-1 and the second source/drain contact 120-2 includes a barrier layer 122 and a metal fill layer 124.

In some embodiments, the channel members 108 may include a semiconductor material, such as silicon (Si), germanium (Ge), or silicon germanium (SiGe). In one embodiment, the channel members 108 are formed of silicon (Si). The gate dielectric layer 112 may include an interfacial layer and a high-k dielectric layer. In some embodiments, the interfacial layer may include a dielectric material such as silicon oxide layer. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 114 may include one or more work function layers and a metal fill layer. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The first p-type epitaxial feature 116P-1 and the second p-type epitaxial feature 116P-2 may be a semiconductor material such as silicon germanium (SiGe) and is doped with a p-type dopant, such as boron (B).

In some embodiments, the inner spacer features 118 include silicon oxide, hafnium silicide, silicon oxycarbide, silicon oxynitride, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The metal fill layer 124 for the source/drain contact 120 may be formed of tungsten (W), ruthenium (Ru), cobalt (Co), nickel (Ni), or copper (Cu). The barrier layer 122 may be formed of titanium nitride (TiN), tantalum nitride (TaN), titanium (Ti), molybdenum (Mo), cobalt nitride (CoN), tungsten nitride (WN), or titanium silicon nitride (TiSiN).

The gate structure 110, the first p-type epitaxial feature 116P-1, the second p-type epitaxial feature 116P-2, and the bottommost inner spacer features 118 are disposed on an n-type well region 102N. In some implementations, the n-type well region 102N is doped with an n-type dopant such as phosphorus (P) or arsenide (As) and has a first doping concentration (C1) between about $1 \times 10^{18}$ and about $1 \times 10^{19}$ atoms/cm$^2$. The n-type well region 102N is disposed over and electrically coupled to a backside conductive feature 130. The backside conductive feature 130 may be referred to as a power rail or a backside power rail. In some embodiments illustrated in FIG. 1, the backside conductive feature 130 serves as or is electrically coupled to a first base electrode 204. The first source/drain contact 120-1 serves as or is electrically coupled to a first emitter electrode 202. The second source/drain contact 120-2 serves as or is electrically coupled to a first collector electrode 206. To reduce contact resistance between the n-type well region 102N and the backside conductive feature 130, the first device structure 100-1 further includes a first epitaxial layer 126-1 and a silicide layer 128. In some implementations, the first epitaxial layer 126-1 may include silicon (Si) and is epitaxially grown on the n-type well region. The silicide layer 128 interposes between the first epitaxial layer 126-1 and the backside conductive feature 130. In some embodiments, the first epitaxial layer 126-1 is doped in-situ with an n-type dopant, such as phosphorus (P) or arsenic (As) and has a second doping concentration (C2) between about $1 \times 10^{19}$ and about $1 \times 10^{20}$ atoms/cm$^2$. The second doping concentration (C2) is greater than the first doping concentration (C1) to reduce contact resistance. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu). In that sense, the backside conductive feature 130 is a metal line disposed below the first device structure 100-1. Because the first device structure 100-1 is fabricated along with MBC transistors that serve core (i.e., logic) or memory functions, the dimensions of the backside conductive feature 130, such as its length, thickness or width, are largely determined based on the designs of the MBC transistors. As will be described below, in some embodiments, isolation structures may be implemented to prevent shorting between an emitter and a base. An isolation structure may divide a backside conductive feature 130 into multiple segments.

Reference is now made to FIG. 2, which illustrates a fragmentary top view of the first device structure 100-1. The n-type well region 102N is doped region in a substrate 102, which may be formed of a semiconductor material, such as silicon (Si). In some alternative embodiments, the substrate 102 may include other semiconductor materials, such as silicon germanium (SiGe) or germanium (Ge). A portion of the n-type well region 102N may be patterned along with the plurality of channel members 108 to form a base portion or a semiconductor body disposed below the plurality of channel members 108. Although not explicitly shown in the figures, the base portion formed of the n-type well region 102N may be defined in an isolation feature. In some embodiments, the isolation feature may include silicon oxide, silicon nitride, silicon oxynitride, fluorine-doped silicate glass (FSG), a low-k dielectric, combinations thereof, and/or other suitable materials. The isolation feature may also be referred to as a shallow trench isolation (STI) feature. With the substrate 102 flipped over, the first epitaxial layer 126-1 is epitaxially grown on the exposed surface of the n-type well region 102N and the silicide layer 128 is formed over the first epitaxial layer 126-1. After a planarization process, such as a CMP process, a dielectric layer is deposited over the STI feature and the silicide layer 128. An opening is then formed in the dielectric layer by use of lithography processes and etch processes to expose the silicide layer 128. Thereafter, the backside conductive feature 130 is deposited over the silicide layer 128. The first epitaxial layer 126-1, the silicide layer 128, and the backside conductive feature 130 may substantially coincide around all edges along the Z direction. It can be seen from FIGS. 1 and 2 that the n-type well region 102N extends lengthwise along the X direction and may be regarded as an elongated semiconductor body that is doped with an n-type dopant. The dielectric layer that surrounds the backside conductive feature 130 may be referred to as an interlayer dielectric (ILD) layer and may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The first device structure 100-1 neither functions nor is electrically connected as an MBC transistor. As shown in FIG. 1, the gate structure 110 of the first device structure 100-1 is electrically floating and is not configured to turn on the channel members 108. The first source/drain contact 120-1 may include or be resistively coupled to a first emitter electrode 202. The second source/drain contact 120-2 may include or be resistively coupled to a first collector electrode 206. The backside conductive feature 130 may include or be resistively coupled to a first base electrode 204. When connected as such, the first device structure 100-1 may function as a P-N-P bipolar junction transistor (BJT) 300-1, shown in FIG. 7. With reference to FIG. 1, a p-n junction of the P-N-P BJT 300-1 exists between the first p-type epitaxial feature 116P-1 and the n-type well region 102N and an n-p junction of the P-N-P BJT 300-1 exists between the n-type well region 102N and the second p-type epitaxial feature 116P-2. It is noted that the n-type well region 102N has a first minimum thickness T1 measured from the silicide layer 128 along the Z direction. In some embodiments, the first minimum thickness (T1) may be between 50 nanometer (nm) and about 100 nm and, according to experiments, is sufficient to isolate the first p-type epitaxial feature 116P-1 from the silicide layer 128 to prevent shorting. The first minimum thickness T1 is determined by the dielectric constant of the substrate 102. Experimental results show that when the substrate 102 is formed of silicon with a dielectric constant of about 11.7, emitter-to-base short is more likely when the distance between the first p-type epitaxial feature 116P-1 (or the first n-type epitaxial feature 116N-1) and the silicide layer 128 is less than 50 nm.

Reference is now made to FIG. 3, which illustrates a fragmentary cross-sectional view of a second device structure 100-2. In the second device structure 100-2, the n-type well region 102N has a second minimum thickness T2 between the silicide layer 128 and the first p-type epitaxial feature 116P-1. When the second minimum thickness T2 is between about 20 nm and about 50 nm, the first p-type epitaxial feature 116P-1 may be shorted to the silicide layer 128, rendering the P-N-P BJT inoperative. To prevent the shorting between the first p-type epitaxial feature 116P-1 and the silicide layer 128, the second device structure 100-2 includes an isolation structure 132 disposed directly below the first p-type epitaxial feature 116P-1. The isolation structure 132 functions to prevent the silicide layer 128 (as well as the backside conductive feature 130) from extending directly below the first p-type epitaxial feature 116P-1 and to increase spacing in between. The isolation structure 132 may include silicon oxide, silicon nitride, silicon oxynitride, silicon oxycarbonitride, or other suitable dielectric materials. As shown in FIGS. 3 and 4, besides the second minimum thickness T2 and the isolation structure 132, the second device structure 100-2 is similar to the first device structure 100-1. With the isolation structure 132 in place, the first epitaxial layer 126-1, the silicide layer 128, and the backside conductive feature 130 may substantially coincide around all edges along the Z direction below the second p-type epitaxial feature 116P-2. Detailed description of the second device structure 100-2 is therefore omitted for brevity.

Like the first device structure 100-1, the second device structure 100-2 neither functions nor is electrically connected like an MBC transistor. As shown in FIG. 3, the gate structure 110 of the second device structure 100-2 is electrically floating and is not configured to turn on the channel members 108. The first source/drain contact 120-1 may include or be resistively coupled to the first emitter electrode 202. The second source/drain contact 120-2 may include or be resistively coupled to the first collector electrode 206. The backside conductive feature 130 may include or be resistively coupled to the first base electrode 204. When connected as such, the second device structure 100-2 may function as a P-N-P bipolar junction transistor (BJT) 300-1, shown in FIG. 7. With reference to FIG. 3, a p-n junction of the P-N-P BJT 300-1 exists between the first p-type epitaxial feature 116P-1 and the n-type well region 102N and an n-p junction of the P-N-P BJT 300-1 exists between the n-type well region 102N and the second p-type epitaxial feature 116P-2.

FIG. 5 illustrates a fragmentary cross-sectional view of a third device structure 100-3 when viewed along the Y direction. As shown in FIG. 5, the third device structure 100-3 includes a plurality of channel members 108 extending along the X direction between a p-type epitaxial feature 116P and an n-type epitaxial feature 116N. Because the p-type epitaxial feature 116P and the n-type epitaxial feature 116N are fabricated along with MBC transistors, the p-type epitaxial feature 116P may also be referred to as a p-type source/drain feature 116P and the n-type epitaxial feature 116N may also be referred to as an n-type source/drain feature 116N. Like the first device structure 100-1, the third device structure 100-3 includes a gate structure 110 that extends lengthwise along the Y direction. The gate structure 110 wraps around each of the plurality of channel members 108. The gate structure 110 includes a gate dielectric layer 112 and a gate electrode 114. The gate structure 110 is isolated from the p-type epitaxial feature 116P and the n-type epitaxial feature 116N by a plurality of inner spacer features 118. The plurality of inner spacer features 118 interleave the plurality of channel members 108. The third device structure 100-3 includes the first source/drain contact 120-1 disposed over and electrically coupled to the p-type epitaxial feature 116P and a third source/drain contact 120-3 disposed over and electrically coupled to the n-type epitaxial feature 116N. In some implementations represented in FIG. 5, each of the first source/drain contact 120-1 and the third source/drain contact 120-3 includes a barrier layer 122 and a metal fill layer 124.

The channel members 108, the gate dielectric layer 112, gate electrode 114, the inner spacer features 118, the first source/drain contact 120-1, and the third source/drain contact 120-3 of the third device structure 100-3 may be similar to those in the first device structure 100-1 shown in FIG. 1. Detailed descriptions of them are therefore omitted for brevity.

The gate structure 110, the p-type epitaxial feature 116P, the n-type epitaxial feature 116N, and the bottommost inner spacer features 118 are disposed on an n-type well region 102N. In some implementations, the n-type well region 102N is doped with an n-type dopant such as phosphorus (P) or arsenide (As) and has a first doping concentration (C1) between about $1 \times 10^{18}$ and about $1 \times 10^{19}$ atoms/cm$^2$. The n-type well region 102N is disposed over and electrically coupled to a backside conductive feature 130. The backside conductive feature 130 may be referred to as a power rail or backside power rail. In some embodiments illustrated in FIG. 5, the backside conductive feature 130 serves as or is electrically coupled to the first collector electrode 206. The first source/drain contact 120-1 serves as or is electrically coupled to the first emitter electrode 202. The third source/drain contact 120-3 serves as or is electrically coupled to the first base electrode 204. In order to form a P-N-P BJT, the third device structure 100-3 further includes a rectifying Schottky junction below the n-type well region 102N. The rectifying Schottky junction may also be referred to as a Schottky barrier junction or a Schottky barrier contact. In some instances shown in FIG. 5, the third device structure 100-3 includes a silicide layer 128 and the rectifying Schottky junction exists between the n-type well region 102N and the silicide layer 128. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Reference is now made to FIG. 6, which illustrates a fragmentary top view of the third device structure 100-3. The n-type well region 102N is doped region in a substrate 102, which may be formed of a semiconductor material, such as silicon (Si). In some alternative embodiments, the substrate 102 may include other semiconductor materials, such as silicon germanium (SiGe) or germanium (Ge). A portion of the n-type well region 102N may be patterned along with the plurality of channel members 108 to form a base portion or a semiconductor body disposed below the plurality of channel members 108. Although not explicitly shown in the figures, the base portion formed of the n-type well region 102N may be defined in an isolation feature. In some embodiments, the isolation feature may include silicon oxide, silicon nitride, silicon oxynitride, fluorine-doped silicate glass (FSG), a low-k dielectric, combinations thereof, and/or other suitable materials. The isolation feature may also be referred to as a shallow trench isolation (STI) feature. With the substrate 102 flipped over, the silicide layer 128 is formed on the exposed surface of the n-type well region 102N. After a planarization process, such as a CMP process, an ILD layer is deposited over the isolation feature and the silicide layer 128. An opening is then formed in the ILD layer by use of lithography processes and etch processes to expose the silicide layer 128. Thereafter, the backside conductive feature 130 is deposited over the silicide layer 128. It can be seen from FIGS. 5 and 6 that the n-type well region 102N extends lengthwise along the X direction and may be regarded as an elongated semiconductor body that is doped with an n-type dopant. As shown in FIG. 6, the first epitaxial layer 126-1, the silicide layer 128, and the backside conductive feature 130 may substantially coincide around all edges along the Z direction. As the ILD layer has been described before, detailed description thereof will not be repeated here for brevity.

The third device structure 100-3 neither functions nor is electrically connected like an MBC transistor. As shown in FIG. 5, the gate structure 110 of the third device structure 100-3 is electrically floating and is not configured to turn on the channel members 108. The first source/drain contact 120-1 may include or be resistively coupled to the first emitter electrode 202. The third source/drain contacts 120-3 may include or be resistively coupled to the first base electrode 204. The backside conductive feature 130 may include or be resistively coupled to the first collector electrode 206. When connected as such, the third device structure 100-3 may function as a P-N-P bipolar junction transistor (BJT) 300-1, shown in FIG. 7. With reference to FIG. 5, a p-n junction of the P-N-P BJT 300-1 exists between the p-type epitaxial feature 116P and the n-type well region 102N and an n-p junction of the P-N-P BJT 300-1 exists between the n-type well region 102N and the Schottky junction between the n-type well region 102N and the silicide layer 128. The n-type epitaxial feature 116N is coupled to the n-type well region 102N by ohmic contact. It is noted that the n-type well region 102N of the third device structure 100-3 has a first minimum thickness T1 measured from the silicide layer 128 along the Z direction. In some embodiments, the first minimum thickness (T1) may be between 50 nm and about 100 nm and, according to experiments, is sufficient to isolate the p-type epitaxial feature 116P from the silicide layer 128 to prevent shorting.

The present disclosure also provides embodiments of N-P-N BJT structures, such as the device structures shown in FIGS. 8-13.

FIG. 8 illustrates a fragmentary cross-sectional view of a fourth device structure 100-4 viewed along the Y direction. The fourth device structure 100-4 includes a plurality of channel members 108 extending along the X direction between a first n-type epitaxial feature 116N-1 and a second n-type epitaxial feature 116N-2. Because the first n-type epitaxial feature 116N-1 and the second n-type epitaxial feature 116N-2 are fabricated along with MBC transistors, they may also be referred to as first and second n-type source/drain features 116N-1 and 116N-2, respectively. The fourth device structure 100-4 includes a gate structure 110 that extends lengthwise along the Y direction. The gate structure 110 wraps around each of the plurality of channel members 108. As shown in FIG. 8, the gate structure 110 includes a gate dielectric layer 112 and a gate electrode 114. The gate structure 110 is isolated from the first and second n-type source/drain features 116N-1 and 116N-2 by a plurality of inner spacer features 118. The plurality of inner spacer features 118 interleave the plurality of channel members 108. A fourth source/drain contact 120-4 is disposed over and electrically coupled to the first n-type source/drain feature 116N-1 and a fifth source/drain contact 120-5 is disposed over and electrically coupled to the second n-type source/drain feature 116N-2. In some implementations represented in FIG. 8, each of the fourth source/drain contact 120-4 and the fifth source/drain contact 120-5 includes a barrier layer 122 and a metal fill layer 124.

The channel members 108, the gate dielectric layer 112, the gate electrode 114, the inner spacer features 118, the metal filler layer 124, and the barrier layer 122 in the fourth device structure 100-4 may be similar to counterparts in the first device structure 100-1 and detailed description of them are omitted for brevity. The first n-type epitaxial feature 116N-1 and the second n-type epitaxial feature 116N-2 may include a semiconductor material such as silicon and is doped with an n-type dopant, such as phosphorus (P) or arsenic (As).

The gate structure 110, the first n-type epitaxial feature 116N-1, the second n-type epitaxial feature 116N-2, and the bottommost inner spacer features 118 are disposed on a p-type well region 102P. In some implementations, the p-type well region 102P is doped with a p-type dopant such as boron (B) and has a third doping concentration (C3) between about $1\times10^{18}$ and about $1\times10^{19}$ atoms/cm$^2$. The p-type well region 102P is disposed over and electrically coupled to a backside conductive feature 130. The backside conductive feature 130 may be referred to as a power rail or a backside power rail. In some embodiments illustrated in FIG. 8, the backside conductive feature 130 serves as or is electrically coupled to a second base electrode 214. The fourth source/drain contact 120-4 serves as or is electrically coupled to a second emitter electrode 212. The fifth source/drain contact 120-5 serves as or is electrically coupled to a second collector electrode 216. To reduce contact resistance between the p-type well region 102P and the backside conductive feature 130, the fourth device structure 100-4 further includes a second epitaxial layer 126-2 and a silicide layer 128. In some implementations, the second epitaxial layer 126-2 may include silicon germanium (SiGe) and is epitaxially grown on the p-type well region 102P. The silicide layer 128 interposes between the second epitaxial layer 126-2 and the backside conductive feature 130. In some embodiments, the second epitaxial layer 126-2 is doped in-situ with a p-type dopant, such as boron (B), and has a fourth doping concentration (C4) between about $1\times10^{19}$ and about $1\times10^{20}$ atoms/cm$^2$. The fourth doping concentration (C4) is greater than the third doping concentration (C3) to reduce contact resistance. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Reference is now made to FIG. 9, which illustrates a fragmentary top view of the fourth device structure 100-4. The p-type well region 102P is doped region in a substrate 102, which may be formed of a semiconductor material, such as silicon (Si). In some alternative embodiments, the substrate 102 may include other semiconductor materials, such as silicon germanium (SiGe) or germanium (Ge). A portion of the p-type well region 102P may be patterned along with the plurality of channel members 108 to form a base portion or a semiconductor body disposed below the plurality of channel members 108. Although not explicitly shown in the figures, the base portion formed of the p-type well region 102P may be defined in an STI feature. With the substrate 102 flipped over, the second epitaxial layer 126-2 is epitaxially grown on the exposed surface of the p-type well region 102P and the silicide layer 128 is formed on the second epitaxial layer 126-2. After a planarization process, such as a CMP process, an ILD layer is deposited over the isolation feature and the silicide layer 128. An opening is then formed in the ILD layer by use of lithography processes and etch processes to expose the silicide layer 128. Thereafter, the backside conductive feature 130 is deposited over the silicide layer 128. It can be seen from FIGS. 8 and 9 that the p-type well region 102P extends lengthwise along the X direction and may be regarded as an elongated semiconductor body that is doped with a p-type dopant. As shown in FIG. 9, the second epitaxial layer 126-2, the silicide layer 128, and the backside conductive feature 130 may substantially coincide around all edges along the Z direction. As the ILD layer has been described before, detailed description thereof will not be repeated here for brevity.

The fourth device structure 100-4 neither functions nor is electrically connected like an MBC transistor. As shown in FIG. 8, the gate structure 110 of the fourth device structure 100-4 is electrically floating and is not configured to turn on the channel members 108. The fourth source/drain contact 120-4 may include or be resistively coupled to the second emitter electrode 212. The fifth source/drain contact 120-5 may include or be resistively coupled to the second collector electrode 216. The backside conductive feature 130 may include or be resistively coupled to the second base electrode 214. When connected as such, the fourth device structure 100-4 may function as an N-P-N bipolar junction transistor (BJT) 300-2, shown in FIG. 14. With reference to FIG. 8, an n-p junction of the N-P-N BJT 300-2 exists between the first n-type epitaxial feature 116N-1 and the p-type well region 102P and a p-n junction of the N-P-N BJT 300-2 exists between the p-type well region 102P and the second n-type epitaxial feature 116N-2. It is noted that the p-type well region 102P has a first minimum thickness T1 measured from the silicide layer 128 along the Z direction. In some embodiments, the first minimum thickness (T1) may be between 50 nm and about 100 nm and, according to experiments, is sufficient to isolate the first n-type epitaxial feature 116N-1 from the silicide layer 128 to prevent shorting.

Reference is now made to FIG. 10, which illustrates a fragmentary cross-sectional view of a fifth device structure 100-5. In the fifth device structure 100-5, the p-type well region 102P has a second minimum thickness T2 between the silicide layer 128 and the first n-type epitaxial feature 116N-1. When the second minimum thickness T2 is between about 20 nm and about 50 nm, the first n-type epitaxial feature 116N-1 may be shorted to the silicide layer 128, rendering the N-P-N BJT inoperative. To prevent the shorting between the first n-type epitaxial feature 116N-1 and the silicide layer 128, the fifth device structure 100-5 includes an isolation structure 132 disposed directly below the first n-type epitaxial feature 116N-1. The isolation structure 132 functions to prevent the silicide layer 128 (as well as the backside conductive feature 130) from extending directly below the first n-type epitaxial feature 116N-1 and to increase spacing in between. The isolation structure 132 may include silicon oxide, silicon nitride, silicon oxynitride, silicon oxycarbonitride, or other suitable dielectric materials. As shown in FIGS. 10 and 11, besides the second minimum thickness T2 and the isolation structure 132, the fifth device structure 100-5 is similar to the fourth device structure 100-4. Referring to FIG. 11, with the isolation structure 132 in place, the second epitaxial layer 126-2, the silicide layer 128, and the backside conductive feature 130 may substantially coincide around all edges along the Z direction below the second n-type epitaxial feature 116N-2. Detailed description of the fifth device structure 100-5 is therefore omitted for brevity.

Like the fourth device structure 100-4, the fifth device structure 100-5 neither functions nor is electrically connected like an MBC transistor. As shown in FIG. 10, the gate structure 110 of the fifth device structure 100-5 is electrically floating and is not configured to turn on the channel members 108. The fourth source/drain contact 120-4 may include or be resistively coupled to the second emitter electrode 212. The fifth source/drain contact 120-5 may include or be resistively coupled to the second collector electrode 216. The backside conductive feature 130 may include or be resistively coupled to the second base electrode 214. When connected as such, the fifth device structure 100-5 may function as an N-P-N bipolar junction transistor (BJT) 300-2, shown in FIG. 14. With reference to FIG. 10, an n-p junction of the N-P-N BJT 300-2 exists between the first n-type epitaxial feature 116N-1 and the p-type well region 102P and a p-n junction of the N-P-N BJT 300-2 exists between the p-type well region 102P and the second n-type epitaxial feature 116N-2.

FIG. 12 illustrates a fragmentary cross-sectional view of a sixth device structure 100-6 when viewed along the Y direction. As shown in FIG. 12, the sixth device structure 100-6 includes a plurality of channel members 108 extending along the X direction between an n-type epitaxial feature 116N and a p-type epitaxial feature 116P. Because the n-type epitaxial feature 116N and the p-type epitaxial feature 116P are fabricated along with MBC transistors, the n-type epitaxial feature 116N may also be referred to as an n-type source/drain feature 116N and the p-type epitaxial feature 116P may also be referred to as a p-type source/drain feature 116P. The sixth device structure 100-6 includes a gate structure 110 that extends lengthwise along the Y direction. The gate structure 110 wraps around each of the plurality of channel members 108. The gate structure 110 includes a gate dielectric layer 112 and a gate electrode 114. The gate structure 110 is isolated from the n-type epitaxial feature 116N and the p-type epitaxial feature 116P by a plurality of inner spacer features 118. The plurality of inner spacer features 118 interleave the plurality of channel members 108. The sixth device structure 100-6 includes the fourth source/drain contact 120-4 disposed over and electrically coupled to the n-type epitaxial feature 116N and a sixth source/drain contact 120-6 disposed over and electrically coupled to the p-type epitaxial feature 116P. In some implementations represented in FIG. 12, each of the fourth source/drain contact 120-4 and the sixth source/drain contact 120-6 includes a barrier layer 122 and a metal fill layer 124.

The channel members 108, the gate dielectric layer 112, gate electrode 114, the inner spacer features 118, the fourth source/drain contact 120-4, and the sixth source/drain contact 120-6 of the sixth device structure 100-6 may be similar to those of the fourth device structure 100-4 shown in FIG. 8. Detailed descriptions of them are therefore omitted for brevity.

The gate structure 110, the n-type epitaxial feature 116N, the p-type epitaxial feature 116P, and the bottommost inner spacer features 118 are disposed on the p-type well region 102P. In some implementations, the p-type well region 102P is doped with a p-type dopant such as boron (B) and has a third doping concentration (C3) between about $1 \times 10^{18}$ and about $1 \times 10^{19}$ atoms/cm$^2$. The p-type well region 102P is disposed over and electrically coupled to a backside conductive feature 130. In some embodiments illustrated in FIG. 12, the backside conductive feature 130 serves as or is electrically coupled to the second collector electrode 216. The fourth source/drain contact 120-4 serves as or is electrically coupled to the second emitter electrode 212. The sixth source/drain contact 120-6 serves as or is electrically coupled to the second base electrode 214. In order to form an N-P-N BJT, the sixth device structure 100-6 further includes a rectifying Schottky junction below the p-type well region 102P. The rectifying Schottky junction may also be referred to as a Schottky barrier junction or a Schottky barrier contact. In some instances shown in FIG. 12, the sixth device structure 100-6 includes a silicide layer 128 and the rectifying Schottky junction exists between the p-type well region 102P and the silicide layer 128. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Reference is now made to FIG. 13, which illustrates a fragmentary top view of the sixth device structure 100-6. The p-type well region 102P is doped region in a substrate 102, which may be formed of a semiconductor material, such as silicon (Si). In some alternative embodiments, the substrate 102 may include other semiconductor materials, such as silicon germanium (SiGe) or germanium (Ge). A portion of the p-type well region 102P may be patterned along with the plurality of channel members 108 to form a base portion or a semiconductor body disposed below the plurality of channel members 108. Although not explicitly shown in the figures, the base portion formed of the p-type well region 102P may be defined in an STI feature. With the substrate 102 flipped over, the silicide layer 128 is formed on the exposed surface of the p-type well region 102P. After a planarization process, an ILD layer is deposited over the STI feature and the silicide layer 128. An opening is then formed in the ILD layer by use of lithography processes and etch processes to expose the silicide layer 128. Thereafter, the backside conductive feature 130 is deposited over the silicide layer 128. As shown in FIG. 13, the second epitaxial layer 126-2, the silicide layer 128, and the backside conductive feature 130 may substantially coincide around all edges along the Z direction.

The sixth device structure 100-6 neither functions nor is electrically connected like an MBC transistor. As shown in FIG. 12, the gate structure 110 of the sixth device structure 100-6 is electrically floating and is not configured to turn on the channel members 108. The fourth source/drain contacts 120-4 may include or be resistively coupled to the second emitter electrode 212. The sixth source/drain contacts 120-6 may include or be resistively coupled to the second base electrode 214. The backside conductive feature 130 may include or be resistively coupled to the second collector electrode 216. When connected as such, the sixth device structure 100-6 may function as an N-P-N bipolar junction transistor (BJT) 300-2, shown in FIG. 14. With reference to FIG. 12, an n-p junction of the N-P-N BJT 300-2 exists between the n-type epitaxial feature 116N and the p-type well region 102P and a p-n junction of the N-P-N BJT 300-2 exists between the p-type well region 102P and the Schottky junction between the p-type well region 102P and the silicide layer 128. The p-type epitaxial feature 116P is coupled to the p-type well region 102P by ohmic contact. It is noted that the p-type well region 102P has a first minimum thickness T1 measured from the silicide layer 128 along the Z direction. In some embodiments, the first minimum thickness (T1) may be between 50 nm and about 100 nm and, according to experiments, is sufficient to isolate the n-type epitaxial feature 116N from the silicide layer 128 to prevent shorting.

Reference is now made to FIG. 15. A plurality of the first device structure 100-1, the second device structure 100-2, the third device structure 100-3, the fourth device structure 100-4, the fifth device structure 100-5, and the sixth device structure 100-6 may be connected in parallel to function as one BJT. For ease of reference, the first device structure 100-1, the second device structure 100-2, the third device structure 100-3, the fourth device structure 100-4, the fifth device structure 100-5, and the sixth device structure 100-6 may be collectively referred to a device 100 and illustrated as such in FIG. 15. Each of the first device structure 100-1, the second device structure 100-2, the third device structure 100-3, the fourth device structure 100-4, the fifth device structure 100-5, and the sixth device structure 100-6 may serve as a repeating unit and be duplicated along the X direction and the Y direction in a semiconductor device 400. As used herein, connection in parallel refers to connecting all emitter electrodes together, connecting all collector electrodes together, and connecting all base electrodes together. In some embodiments illustrated in FIG. 15, emitter electrodes of the repeating devices 100 may be coupled together by a first slot source/drain contact 1201 extending along the Y direction. Depending on the design of the device 100, a second slot source/drain contact 1202, which also extends along the Y direction, may be used to couple collector electrodes (for example, when the device 100 is the first device structure 100-1, the second device structure 100-2, the fourth device structure 100-4, or the fifth device structure 100-5) or base electrodes (for example, when the device 100 is the third device structure 100-3 or the sixth device structure 100-6). In the depicted embodiments, common backside conductive features 1301 and 1302, which may extend along the Y direction, may be implemented to couple together base electrodes (for example, when the device 100 is the first device structure 100-1 or the fourth device structure 100-4) or collector electrodes (for example, when the device 100 is the third device structure 100-3 or the sixth device structure 100-6). Repeating devices 100 arranged along the Y direction may share the same gate structure 110, which is electrically floating. The isolation structure 132 in the second device structure 100-2 or the fifth device structure 100-5 may prevent a common backside conductive feature from extending along the X direction. Although not explicitly shown in FIG. 15, when the device 100 (as the repeating unit) is the second device structure 100-2 or the fifth device structure 100-5, the common backside conductive feature may extend below and parallel to the second slot source/drain contact 1202, rather than extending perpendicular to the second slot source/drain contact 1202.

In one example aspect, the present disclosure provides a bipolar junction transistor (BJT) in accordance with some embodiments. The BJT includes a first epitaxial feature disposed over a well region, a second epitaxial feature disposed over the well region, a vertical stack of channel members each extending lengthwise between the first epitaxial feature and the second epitaxial feature, a gate structure wrapping around each of the vertical stack of channel members, a first electrode coupled to the well region, an emitter electrode disposed over and coupled to the first epitaxial feature, and a second electrode disposed over and coupled to the second epitaxial feature.

In some embodiments, the gate structure is electrically floating. In some implementations, the first epitaxial feature and the second epitaxial feature include silicon and an n-type dopant, the well region includes a p-type dopant and the first electrode includes a base electrode, and the second electrode includes a collector electrode. In some embodiments, the first epitaxial feature and the second epitaxial feature include silicon germanium and a p-type dopant, the well region includes an n-type dopant, the first electrode includes a base electrode, and the second electrode includes a collector electrode. In some instances, the first epitaxial feature includes silicon germanium and a p-type dopant, the second epitaxial feature includes silicon and an n-type dopant, the well region includes the n-type dopant, the first electrode includes a collector electrode, and the second electrode includes a base electrode. In some embodiments, the BJT may further include a silicide layer disposed between the well region and the first electrode. In some instances, the BJT may further include an epitaxial layer disposed between the silicide layer and the well region. In some implementations, the BJT may further include an isolation structure disposed below the first epitaxial feature. The isolation structure prevents the first electrode from extending directly below the first epitaxial feature. In some embodiments, the BJT may further include a plurality of inner spacer features interleaving the vertical stack of channel members.

Another one aspect of the present disclosure pertains to a semiconductor structure. The semiconductor structure includes a first epitaxial feature and a second epitaxial feature disposed over a first well region, a third epitaxial feature and a fourth epitaxial feature disposed over a second well region, a gate structure disposed between the first epitaxial feature and the second epitaxial feature and between the third epitaxial feature and the fourth epitaxial feature, a first electrode coupled to the first well region, a second electrode coupled to the second well region, a common emitter electrode disposed over and coupled to the first epitaxial feature and the third epitaxial feature, and a third electrode disposed over and coupled to the second epitaxial feature and the fourth epitaxial feature.

In some embodiments, the gate structure is electrically floating. In some implementations, the first epitaxial feature, the second epitaxial feature, the third epitaxial feature, and the fourth epitaxial feature include silicon and an n-type dopant, the first well region and the second well region include a p-type dopant, the first electrode and the second electrode are coupled to a base electrode, and the third electrode includes a collector electrode. In some implementations, the first epitaxial feature, the second epitaxial feature, the third epitaxial feature, and the fourth epitaxial feature include silicon germanium and a p-type dopant, the first well region and the second well region include an n-type dopant, the first electrode and the second electrode are coupled to a common base electrode, and the third electrode includes a common collector electrode. In some implementations, the first epitaxial feature and the third epitaxial feature include silicon germanium and a p-type dopant, the second epitaxial feature and the fourth epitaxial feature include silicon and an n-type dopant, the first well region and the second well region include the n-type dopant, the first electrode and the second electrode are coupled to a common collector electrode, and the third electrode includes a common base electrode. In some instances, the first electrode is disposed below the second epitaxial feature and the second electrode is disposed below the fourth epitaxial feature. In some embodiments, the semiconductor structure may further include an isolation structure disposed below the first epitaxial feature. The isolation structure prevents the first electrode from extending directly below the first epitaxial feature. The first well region includes a thickness between about 20 nanometer (nm) and about 50 nm below the first epitaxial feature.

Yet another aspect of the present disclosure pertains to a semiconductor device. The semiconductor device includes a first-type epitaxial feature and a second-type epitaxial feature disposed over a semiconductor body, a silicide layer disposed below and in contact with the semiconductor body, and a metal line disposed below and in contact with the silicide layer. The silicide layer and the semiconductor body include a Schottky junction. In some embodiments, the first-type epitaxial feature includes silicon germanium and a p-type dopant, the second-type epitaxial feature includes silicon and an n-type dopant, and the semiconductor body is doped with the n-type dopant. In some implementations, the first-type epitaxial feature includes silicon and an n-type dopant, the second-type epitaxial feature includes silicon germanium and a p-type dopant, and the semiconductor body is doped with the p-type dopant. In some instances, the semiconductor device may further include a vertical stack of channel members sandwiched between the first-type epitaxial feature and the second-type epitaxial feature, and a gate structure wrapping around each of the vertical stack of channel members. Each of the first-type epitaxial feature and the second-type epitaxial feature is spaced apart from the gate structure by a plurality of inner spacer features.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a first epitaxial feature and a second epitaxial feature disposed over a first well region;
   a third epitaxial feature and a fourth epitaxial feature disposed over a second well region;
   a gate structure disposed between the first epitaxial feature and the second epitaxial feature and between the third epitaxial feature and the fourth epitaxial feature;
   a first electrode coupled to the first well region;
   a second electrode coupled to the second well region;
   a common emitter electrode disposed over and coupled to the first epitaxial feature and the third epitaxial feature; and
   a third electrode disposed over and coupled to the second epitaxial feature and the fourth epitaxial feature,
   wherein the first epitaxial feature, the second epitaxial feature, the third epitaxial feature, and the fourth epitaxial feature comprise silicon and an n-type dopant,
   wherein the first well region and the second well region comprise a p-type dopant,
   wherein the first electrode and the second electrode are coupled to a base electrode, and
   wherein the third electrode comprises a collector electrode.

2. The semiconductor structure of claim 1, wherein the gate structure is electrically floating.

3. The semiconductor structure of claim 1,
   wherein the first electrode is disposed below the second epitaxial feature,
   wherein the second electrode is disposed below the fourth epitaxial feature.

4. The semiconductor structure of claim 1, further comprising an isolation structure disposed below the first epitaxial feature,
   wherein the isolation structure prevents the first electrode from extending directly below the first epitaxial feature,
   wherein the first well region comprises a thickness between about 20 nanometer (nm) and about 50 nm below the first epitaxial feature.

5. The semiconductor structure of claim 1, further comprising:
   a first vertical stack of nanostructures extending between the first epitaxial feature and the second epitaxial feature; and a second vertical stack of nanostructures extending between the third epitaxial feature and the fourth epitaxial feature.

6. The semiconductor structure of claim 5, wherein the gate structure wraps around each of the first vertical stack of nanostructures and each of the second vertical stack of nanostructures.

7. The semiconductor structure of claim 5, further comprising:
a plurality of inner spacer features interleaving the first vertical stack of nanostructures,
wherein the plurality of inner spacer features comprise silicon oxide, hafnium silicide, silicon oxycarbide, silicon oxynitride, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride.

8. The semiconductor structure of claim 7, wherein the gate structure is spaced apart from the first epitaxial feature by the plurality of inner spacer features.

9. The semiconductor structure of claim 1,
wherein each of the common emitter electrode and the third electrode comprises a barrier layer and a metal fill layer,
wherein the barrier layer comprises titanium nitride (TiN), tantalum nitride (TaN), titanium (Ti), molybdenum (Mo), cobalt nitride (CoN), tungsten nitride (WN), or titanium silicon nitride (TiSiN),
wherein the metal fill layer comprises tungsten (W), ruthenium (Ru), cobalt (Co), nickel (Ni), or copper (Cu).

10. A semiconductor structure, comprising:
a first n-type epitaxial feature and a second n-type epitaxial feature disposed over a first p-type well region;
first channel members extending between the first n-type epitaxial feature and the second n-type epitaxial feature;
a third n-type epitaxial feature and a fourth n-type epitaxial feature disposed over a second p-type well region;
second channel members extending between the third n-type epitaxial feature and the fourth n-type epitaxial feature;
a gate structure extending between the first n-type epitaxial feature and the second n-type epitaxial feature and between the third n-type epitaxial feature and the fourth n-type epitaxial feature;
a first electrode coupled to the first p-type well region;
a second electrode coupled to the second p-type well region;
a common emitter electrode coupled to the first n-type epitaxial feature and the third n-type epitaxial feature; and
a third electrode coupled to the second n-type epitaxial feature and the fourth n-type epitaxial feature,
wherein the first electrode and the second electrode are coupled to a base electrode, and
wherein the third electrode comprises a collector electrode.

11. The semiconductor structure of claim 10, wherein the first channel members and the second channel members comprise silicon.

12. The semiconductor structure of claim 10, wherein the gate structure wraps around each of the first channel members and each of the second channel members.

13. The semiconductor structure of claim 10, wherein the gate structure comprises a gate dielectric layer in contact with the first channel members and the second channel members and a gate electrode spaced apart from the first channel members and the second channel members by the gate dielectric layer.

14. The semiconductor structure of claim 13,
wherein the gate dielectric layer comprises silicon oxide, hafnium oxide, titanium oxide, hafnium zirconium oxide, tantalum oxide, hafnium silicon oxide, zirconium oxide, zirconium silicon oxide,
wherein the gate dielectric layer comprises silicon oxide, hafnium oxide, titanium oxide, hafnium zirconium oxide, tantalum oxide, hafnium silicon oxide, zirconium oxide, zirconium silicon oxide.

15. A semiconductor structure, comprising:
a first n-type epitaxial feature and a second n-type epitaxial feature disposed over a first p-type well region;
first channel members extending between the first n-type epitaxial feature and the second n-type epitaxial feature along a first direction;
a third n-type epitaxial feature and a fourth n-type epitaxial feature disposed over a second p-type well region;
second channel members extending between the third n-type epitaxial feature and the fourth n-type epitaxial feature along the first direction;
a gate structure extending lengthwise along a second direction perpendicular to the first direction and extending between the first n-type epitaxial feature and the second n-type epitaxial feature and between the third n-type epitaxial feature and the fourth n-type epitaxial feature;
a first electrode coupled to the first p-type well region and extending lengthwise along the first direction;
a second electrode coupled to the second p-type well region and extending lengthwise along the first direction;
a common emitter electrode extending lengthwise along the second direction and coupled to the first n-type epitaxial feature and the third n-type epitaxial feature; and
a third electrode extending lengthwise along the lengthwise along the second direction and coupled to the second n-type epitaxial feature and the fourth n-type epitaxial feature,
wherein the first electrode and the second electrode are coupled to a base electrode, and
wherein the third electrode comprises a collector electrode.

16. The semiconductor structure of claim 15, wherein a portion of the gate structure is disposed between the common emitter electrode and the third electrode along the first direction.

17. The semiconductor structure of claim 15, wherein the gate structure wraps around each of the first channel members and each of the second channel members.

18. The semiconductor structure of claim 15,
wherein the first p-type well region is disposed in a substrate,
wherein the first electrode is disposed below the substrate.

19. The semiconductor structure of claim 18, wherein the first electrode is spaced apart from the substrate by an epitaxial layer and a silicide layer.

20. The semiconductor structure of claim 19,
wherein the epitaxial layer comprises silicon germanium and a p-type dopant, wherein the silicide layer comprises titanium silicide (TiSi), nickel silicide (NiSi), cobalt silicide (CoSi), or titanium silicon nitride (TiSiN).

\* \* \* \* \*